(12) United States Patent
Kodama

(10) Patent No.: US 8,099,639 B2
(45) Date of Patent: Jan. 17, 2012

(54) FAILURE ANALYSIS METHOD, FAILURE ANALYSIS SYSTEM, AND MEMORY MACRO SYSTEM

(75) Inventor: Mami Kodama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/563,881

(22) Filed: Sep. 21, 2009

(65) Prior Publication Data

US 2010/0211836 A1    Aug. 19, 2010

(30) Foreign Application Priority Data

Feb. 17, 2009  (JP) ................. 2009-034330

(51) Int. Cl.
*G11C 29/00* (2006.01)
*G11R 31/28* (2006.01)

(52) U.S. Cl. .............. 714/718; 714/733; 714/711

(58) Field of Classification Search ............ 714/25, 714/718, 719, 723, 735, 733, 734, 30, 736, 714/819, 711; 365/201, 230.03, 200; 716/4
See application file for complete search history.

(56) References Cited

U.S. PATENT DOCUMENTS

| | | | |
|---|---|---|---|
| 6,701,477 B1* | 3/2004 | Segal | 714/732 |
| 6,847,563 B2* | 1/2005 | Koshikawa | 365/200 |
| 7,167,405 B1* | 1/2007 | Wong et al. | 365/201 |
| 7,376,872 B1* | 5/2008 | Nelson et al. | 714/718 |
| 7,653,854 B2* | 1/2010 | Anzou et al. | 714/733 |
| 7,739,571 B2* | 6/2010 | Maeda et al. | 714/736 |
| 7,913,126 B2* | 3/2011 | Nakagawa et al. | 714/710 |
| 2008/0022176 A1* | 1/2008 | Anzou et al. | 714/733 |
| 2008/0301508 A1 | 12/2008 | Kodama et al. | |
| 2009/0024885 A1* | 1/2009 | Anzou et al. | 714/719 |

FOREIGN PATENT DOCUMENTS

| | | |
|---|---|---|
| JP | 3256555 | 11/2001 |
| JP | 2008-16156 | 1/2008 |

* cited by examiner

*Primary Examiner* — Phung M Chung
(74) *Attorney, Agent, or Firm* — Finnegan, Henderson, Farabow, Garrett & Dunner, L.L.P.

(57) ABSTRACT

Configuration information including number of normal cell areas and number of spare cell areas arranged in a memory macro and a size of each cell area is extracted from circuit design information, and electrical test results of the normal cell areas and the spare cell areas arranged in the memory macro are collected. Arrangement information corresponding to a collection order of the electrical test results is converted to a two-dimensional coordinate value for two-dimensionally displaying the arrangement information corresponding to a collection order of the electrical test results in a unit of cell area in association with a physical layout of a memory cell in the memory macro based on the configuration information. The collected electrical test results are displayed based on the two-dimensional coordinate value so that the normal cell areas and the spare cell areas can be distinguished.

7 Claims, 10 Drawing Sheets

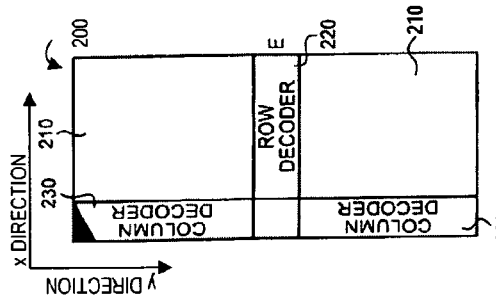
FIG. 3F
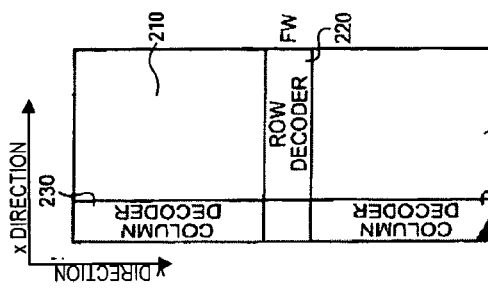
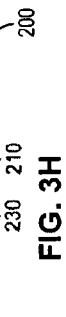
FIG. 3H
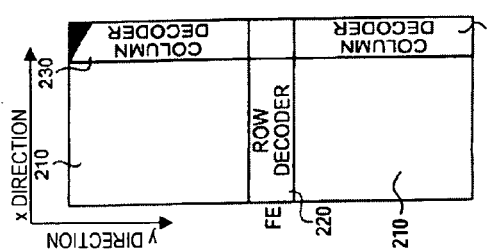
FIG. 3E
FIG. 3G
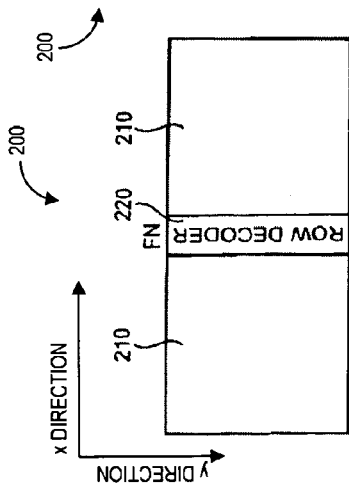
FIG. 3C
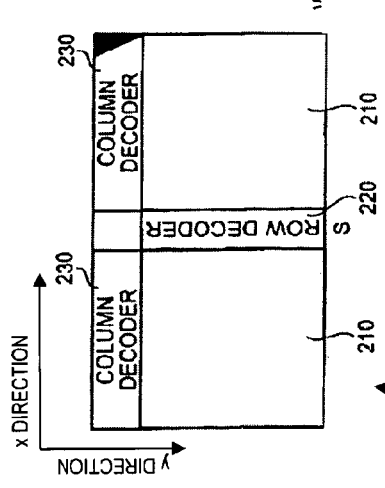
FIG. 3D
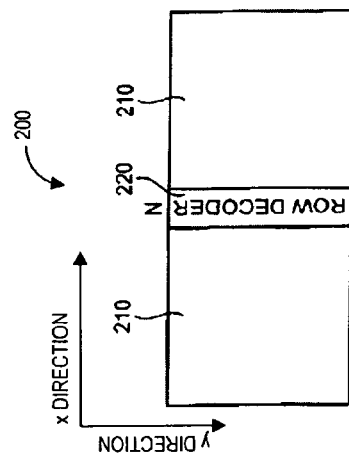
FIG. 3A
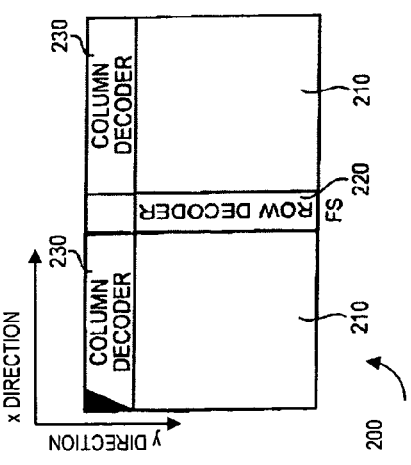
FIG. 3B

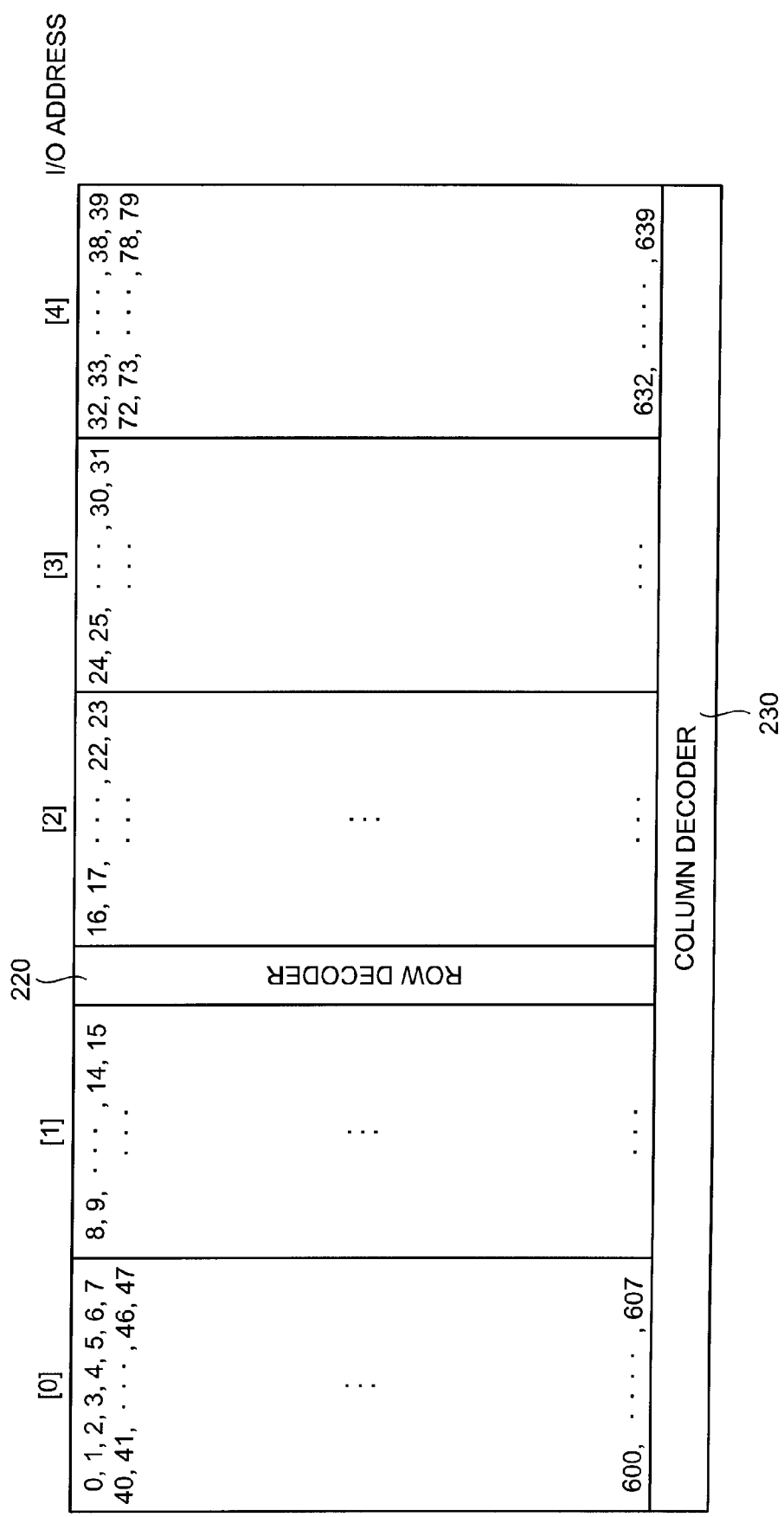

FAILURE ANALYSIS METHOD, FAILURE ANALYSIS SYSTEM, AND MEMORY MACRO SYSTEM

CROSS-REFERENCE TO RELATED APPLICATIONS

This application is based upon and claims the benefit of priority from the prior Japanese Patent Application No. 2009-034330, filed on Feb. 17, 2009; the entire contents of which are incorporated herein by reference.

BACKGROUND OF THE INVENTION

1. Field of the Invention

The present invention relates to a failure analysis method, a failure analysis system, and a memory macro system.

2. Description of the Related Art

Conventionally, in a memory macro incorporated a system LSI, there is a method of specifying a failed bit position (failed memory cell) using a fail bit map (FBM) thereof. To display the FBM, an electrical test result is first detected by a tester for each memory cell. It is a general procedure that one-dimensional array information (logical address) corresponding to a collection order of the electrical test results acquired by the tester is converted to a two-dimensional coordinate value (physical address) associated with a physical layout of the memory cell in the memory macro on a wafer, thereby displaying position information of the failed memory cell ascertained by the electrical test result in a display area such as a display device (for example, see Japanese Patent No. 3256555).

As one type of the memory macro, there is a static random access memory (SRAM) of a type having a spare cell other than normal cells and capable of performing a relieving process such that when a failure is found in one of the normal cells by a failure check based on an electrical test result prior to shipment, the normal cell having a failure is replaced by the spare cell. From the SRAM having such a spare cell, before a relieving process, only electrical test results of normal cells, and after the relieving process, only electrical test results of normal cells excluding the spare cell and the failed cell replaced by the spare cell can be collected. Therefore, if the logical address of the failed memory cell acquired by the electrical test result from the SRAM having the spare cell is converted to a physical address to display the failed memory cell, it is necessary to change interpretation of the position of the failed memory cell displayed on an FBM according to whether it is before or after the relieving process and which memory cell has been relieved. This can be a complicated process to the users. If there is a mistake in the interpretation of the position of the failed memory cell at the time of performing a physical failure analysis (PFA) based on the FBM, a wrong analysis position will be obtained.

BRIEF SUMMARY OF THE INVENTION

A failure analysis method according to an embodiment of the present invention comprises:

extracting configuration information including number of normal cell areas and number of spare cell areas arranged in a memory macro mounted on a semiconductor chip and a size of each cell area from circuit design information;

collecting electrical test results indicating whether each memory cell included in the normal cell areas and the spare cell areas arranged in the memory macro has a failure;

converting arrangement information of the each memory cell corresponding to a collection order of the electrical test results to a two-dimensional coordinate value for two-dimensionally displaying the arrangement information in a unit of cell area in association with a physical layout of a memory cell in the memory macro based on the configuration information; and displaying the collected electrical test results based on the two-dimensional coordinate value so that the normal cell areas and the spare cell areas can be distinguished.

A failure analysis system according to an embodiment of the present invention comprises:

an input unit that receives circuit design information of a memory macro having normal cell areas and spare cell areas mounted on a semiconductor chip, electrical test results indicating whether each memory cell included in the normal cell areas and the spare cell areas arranged in the memory macro has a failure, and an input of information of relieved cell area indicating which normal cell area has been relieved;

a configuration-information extracting unit that extracts configuration information including number of normal cell areas and number of spare cell areas arranged in the memory macro and a size of each cell area from the circuit design information;

a two-dimensional coordinate-value calculator that converts arrangement information of the each memory cell corresponding to a collection order of the electrical test results to a two-dimensional coordinate value for two-dimensionally displaying the arrangement information in a unit of cell area in association with a physical layout of a memory cell in the memory macro based on the configuration information;

a relieved-area specifying unit that converts the input information of relieved cell area to a two-dimensional coordinate value; and an output unit that two-dimensionally displays the collected electrical test results so that a relieved normal cell area, an unrelieved normal cell area, and a spare cell area can be distinguished, based on a two-dimensional coordinate value converted by the two-dimensional coordinate-value calculator and the relieved-area specifying unit.

A memory macro system according to an embodiment of the present invention comprises:

a memory macro having normal cell areas and spare cell areas;

an output system circuit for each cell area that outputs a comparison result between test data written in the normal cell areas and the spare cell areas and the test data output from the normal cell areas and the spare cell areas; and an electrical test circuit that diagnoses all the memory cells included in the memory macro based on a comparison result respectively output from the output system circuit for each cell area, and sequentially outputs a diagnosis result as an electrical test result.

BRIEF DESCRIPTION OF THE DRAWINGS

FIGS. 3A-3H are schematic diagrams for explaining arrangements (orientations) on a system LSI chip of the SRAM macro;

FIG. 12 is a schematic diagram for explaining an example of allocation of a logical address with respect to electrical test results of respective memory cells.

DETAILED DESCRIPTION OF THE INVENTION

Exemplary embodiments of a failure analysis method, a failure analysis system, and a memory macro system according to the present invention will be explained below in detail with reference to the accompanying drawings. The present invention is not limited to the following embodiments.

First, to facilitate understanding of the invention, an arrangement of a SRAM macro on a conventional system LSI chip (semiconductor chip), a configuration of the SRAM macro having a spare cell, a memory macro system including a circuit for collecting electrical test results of the SRAM macro, and problems at the time of generating an FBM from the SRAM macro having a spare cell are specifically explained with reference to FIGS. 1 to 7.

Figure 1:
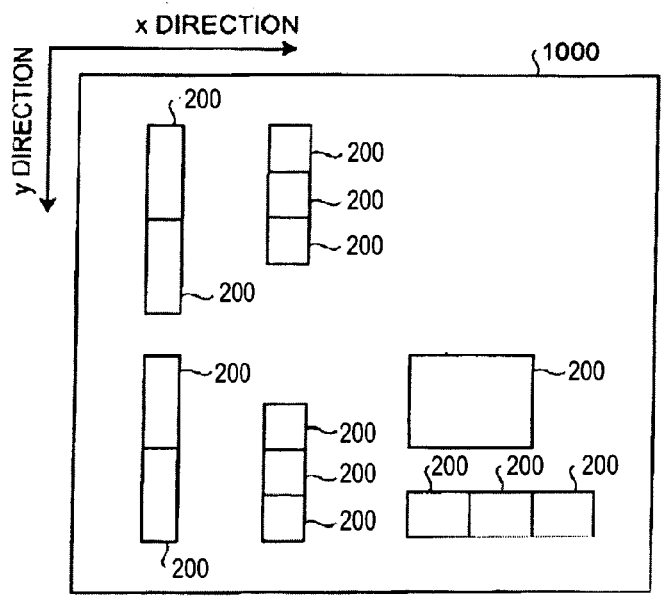
FIG. 1 is a schematic diagram for explaining an example of a floor plan of a system LSI.

Generally, in a system LSI, while a micro processing unit, a logic circuit and the like account for a large portion of a chip layout, many SRAM macros are mounted on the chip. FIG. 1 is a schematic diagram of an example of a floor plan of a chip (chip area) 1000 in a system LSI, for explaining a case that a plurality of SRAM macros 200 are arranged in the chip. FIG. 1 depicts a case that the SRAM macros 200 having a small capacity are located in a distributed manner. The SRAM macros 200 are respectively provided with an identification code of 001 to 014.

Figure 2:
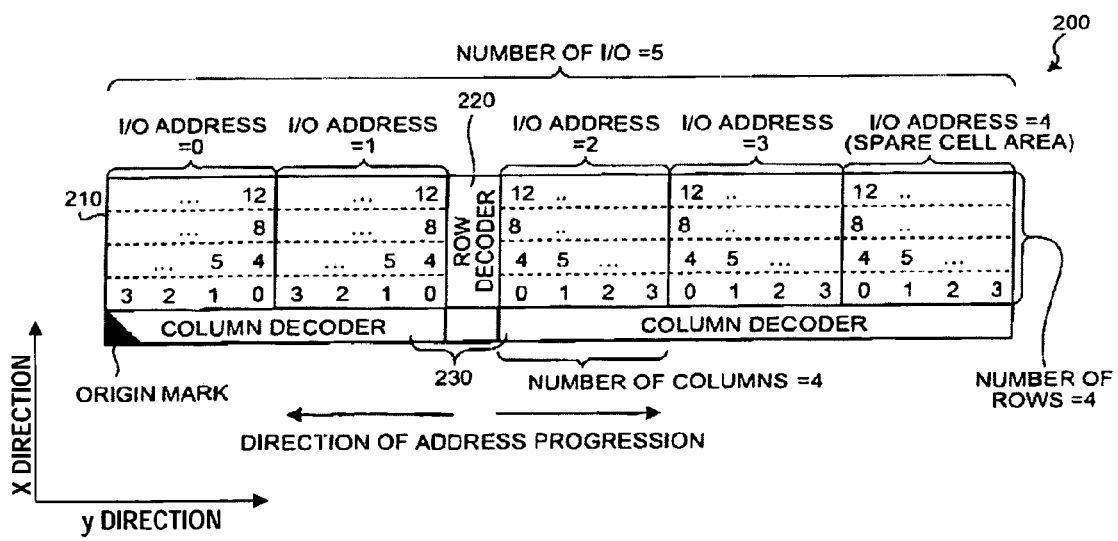
FIG. 2 is an example of a memory array configuration of a SRAM macro having a spare cell.

FIG. 2 is an example of a memory array configuration of the SRAM macro having the spare cell. A SRAM macro 200 shown in FIG. 2 includes a plurality of sub-memory arrays 210, a row decoder 220, and a plurality of column decoders 230. Each sub-memory array 210 includes memory cells arranged in a matrix. The sub-memory arrays 210 are arranged in line in a lateral direction on the drawing and divided into two groups. The row decoder 220 is provided commonly to the divided groups. The column decoder 230 is provided corresponding to each sub-memory array 210. One sub-memory array 210 and the corresponding column decoder 230 constitute one I/O unit.

The SRAM macro shown in FIG. 2 has five I/O units having the sub-memory array 210 with four columns and four rows. A direction of address progression of the memory cell included in each sub-memory array 210 is counted up from the row decoder 220 side toward outside and in order of from the column decoder 230 side (direction shown by arrow in FIG. 2). The black triangle on the left of the left column decoder 230 of the SRAM indicates an origin mark (symbol) of the SRAM macro. Each I/O unit is allocated with an I/O address in an ascending order from the origin mark side. That is, in this case, I/O addresses of 0, 1, 2, 3, and 4 are allocated sequentially to each I/O unit from the left I/O unit on the drawing. In the case of the SRAM macro with spare cell, the I/O unit with the largest I/O address is generally used as a spare cell area. The sub-memory array 210 of the I/O unit with the I/O address of "4" is used here as the spare cell area. The numbers of columns, rows, I/O (I/O units), and spare cells can be acquired from circuit design information.

Hereinafter, the I/O unit with I/O address of "n" (n=0 to 4) is simply referred to as "I/O unit n".

A redundancy circuit (not shown) for relieving any one of the I/O units 0 to 3 as the normal cell area by the I/O unit 4 as the spare cell area is incorporated in the system LSI chip mounted with the SRAM macro having the spare cell. The redundancy circuit stores information for specifying a failed I/O unit (for example, the I/O address) in a fuse, and when there is an access from outside to a failed I/O unit, the redundancy circuit causes the I/O unit 4, which is the spare cell, to be accessed instead of the failed I/O unit. Consequently, even after manufacturing of the system LSI chip, the relieving process can be performed by operating the fuse included in the redundancy circuit.

FIGS. 3A-3H are schematic diagrams for explaining arrangements (orientations) on the system LSI chip of the SRAM macro. Eight kinds (N, S, E, W, FN, FS, and FW) of arrangement are possible, and the SRAM macro is laid out in a desired arrangement on the system LSI chip by a designer. An x-axis direction and a y-axis direction shown in FIGS. 3A-3H respectively correspond to the x-axis direction and the y-axis direction relating to the system LSI chip 1000 shown in FIG. 1. In FIGS. 3A-3H, to facilitate understanding, a SRAM macro with an arrangement in which the number of I/O is two is shown. The SRAM macro in an arrangement FN is reflection-symmetric to the SRAM macro in an arrangement N with regard to the y-axis. The SRAM macro in an arrangement S is acquired by turning the SRAM macro in the arrangement N by 180 degrees in a clockwise or counterclockwise direction. The SRAM macro in the arrangement FS is reflection-symmetric to the SRAM macro in the arrangement S with regard to the y-axis. The SRAM macro in an arrangement E is acquired by turning the SRAM macro in the arrangement N by 90 degrees in a clockwise direction. The SRAM macro in an arrangement FE is reflection-symmetric to the SRAM macro in the arrangement E with regard to the y-axis. The SRAM macro in an arrangement W is acquired by turning the SRAM macro in the arrangement N by 90 degrees in a counterclockwise direction. The SRAM macro in an arrangement FW is reflection-symmetric to the SRAM macro in the arrangement W with regard to the y-axis. It can be acquired from the circuit design information as to which arrangement of N, S, E, W, FN, FS, FE, and FW the SRAM macro is laid out on the system LSI chip (hereinafter, "orientation information" or "layout information").

Figure 4:
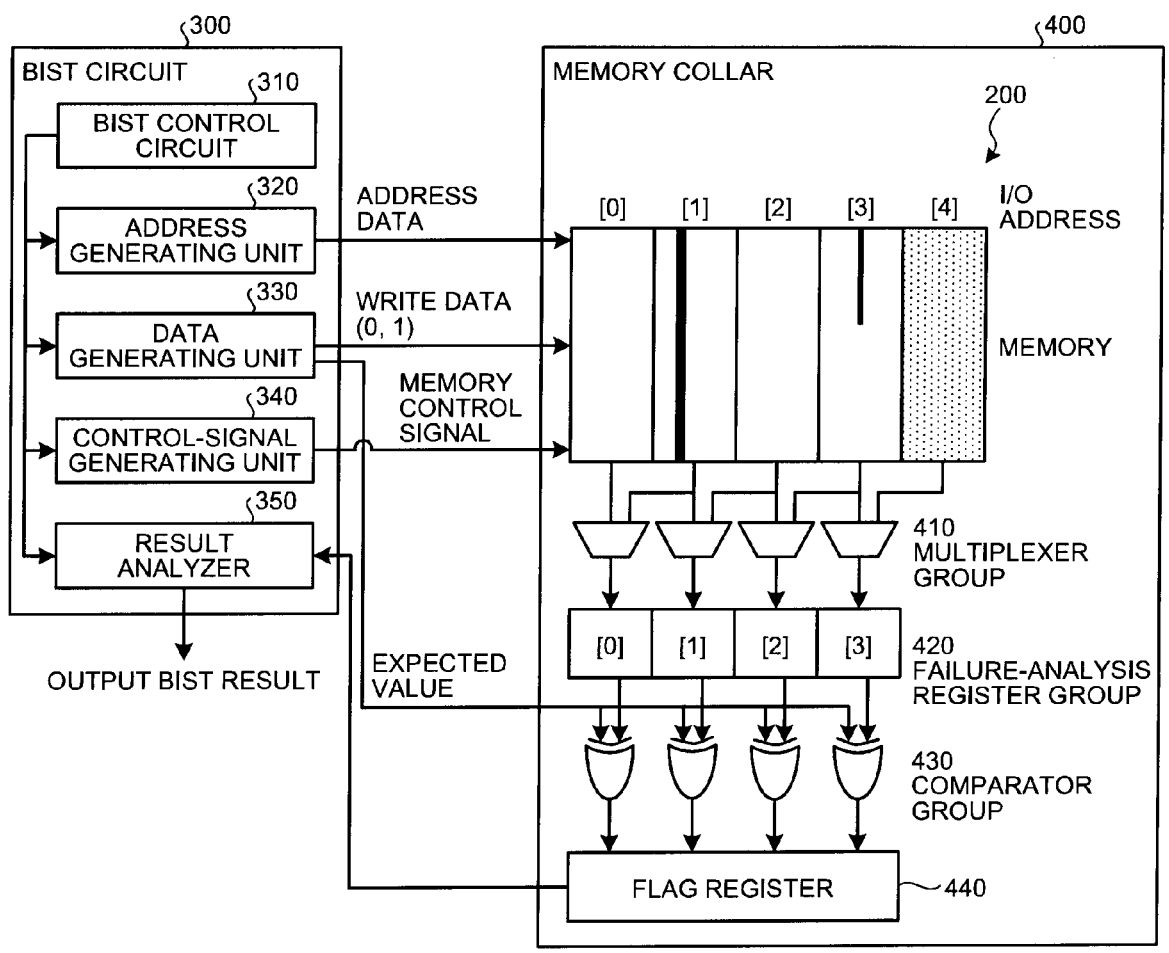
FIG. 4 is a schematic diagram for explaining a configuration of a conventional memory macro system.

A built-in self test (BIST) circuit can be incorporated in the system LSI chip as an electrical test circuit for detecting a failed memory cell by performing a self test (see U.S. Patent Application Publication No. US 2008/0022176). A self test result by the BIST circuit (BIST result) is extracted by the tester, and an FBM is generated based on the extracted BIST result. FIG. 4 is a schematic diagram for explaining a configuration of a memory macro system including the SRAM macro, the BIST circuit, and a general peripheral circuit for the BIST circuit to perform a BIST operation with respect to the SRAM macro. In the explanations below with reference to FIG. 4 and thereafter, a SRAM macro having five I/O units with eight columns and 16 rows, in which an I/O unit with I/O address of "4" is used as a spare cell area, and the orientation information is "N", is taken as an example. As reference numerals attached to the SRAM macro and constituent elements of the SRAM macro, like reference numerals denote like parts shown in FIG. 2.

As shown in FIG. 4, a BIST circuit 300 includes a data generating unit 330 that generates (0, 1) data to be written in a memory array cell, an address generating unit 320 that generates an address to be written or read, matched with progress of the test, a control-signal generating unit 340 that generates a control signal such as Read/Write of the memory, a result analyzer 350 that compares an expected value same as write data with data read from the memory to determine presence of failure, and a BIST control circuit 310 that controls respective constituent elements. Each SRAM macro 200 is included in a block referred to as a memory collar 400 together with a peripheral circuit (output system circuit) required for a BIST operation. One BIST circuit 300 can perform the BIST operation with respect to a plurality of the memory collars 400.

The peripheral circuit (output system circuit) included in each memory collar 400 includes a failure-analysis register group 420 including failure analysis registers of a number equal to the number of I/O units used as the normal cell area of the SRAM macro 200, a multiplexer group 410 arranged between the failure-analysis register group 420 and the SRAM macro 200 for selecting data output from the I/O unit included in the SRAM macro 200 to transmit the selected data to the failure-analysis register group 420, a comparator group 430 including comparators that compare the output data transmitted to the failure-analysis register group 420 with an expected value, and a flag register 440 that stores comparison results respectively output from the comparators in the comparator group 430.

Write data generated by the data generating unit 330, address data generated by the address generating unit 320, and a control signal generated by the control-signal generating unit 340 are provided to the SRAM macro 200. The data output from the SRAM macro 200 is input to the failure-analysis register group 420 via the multiplexer group 410, and temporarily held in the failure-analysis register group 420. An output from the failure-analysis register group 420 is compared with the expected value of data generated by the data generating unit 330 by the comparator group 430, and a comparison result is held in the flag register 440. An output from the flag register 440 is input to the result analyzer 350 in the BIST circuit 300, and a final BIST result is output.

Figure 5:
FIG. 5 is an example of test data to be written to or read from each memory cell address.

FIG. 5 is an example of data (test data) to be written to or read from each memory cell address of the sub-memory array 210. The data is written in the sub-memory array 210 of each I/O unit from the BIST circuit 300, and data read thereafter is input to one failure analysis register of the failure-analysis register group 420. When the sub-memory array 210 of a certain I/O unit has a failure, a value different from the written value is input to the sub-memory array 210 having the failure. It is determined whether there is a failure by comparing the data held in the failure analysis register with the data (that is, the expected value) generated by the address generating unit 320 in the BIST circuit 300 by the comparator in the comparator group 430. The number of failure analysis registers constituting the failure-analysis register group 420 is equal to the number of I/O units used as the normal cell area. Therefore, in the case of the SRAM macro 200 before a relieving process is performed, the multiplexer group 410 selects an input source I/O unit so that only data output from the I/O unit in the normal cell area is stored in the failure-analysis register group 420. In the case of the SRAM macro 200 in which the a relieving process is performed, a function of the multiplexer group 410 selects the input source I/O unit so that data output from the I/O unit in the normal cell area excluding the relieved I/O unit and in the spare cell area is stored in the failure-analysis register group 420. For example, when I/O unit 0 is relieved, data output from the sub-memory array 210 of the I/O unit 1 is input to failure analysis register [0]. Data output from the I/O unit 2, the I/O unit 3, and the I/O unit 4 as the spare cell is input to failure analysis register [1], failure analysis register [2], and failure analysis register [3], respectively.

BIST results associated with the sub-memory arrays 210 are sequentially and serially extracted to the outside by the tester, to generate an FBM indicating a failed part in the sub-memory array 210 based on an extracted result. A logical address is allocated corresponding to an order of the BIST result being extracted. For example, value 0 is allocated to the top BIST result serially extracted from one memory collar 400 (BIST result of the cell array output first), and a value incremented by one is allocated to each BIST result in order of output as the logical address.

That is, the logical address is one-dimensional array information. A specific example of the logical address will be explained later.

According to a conventional method of generating the FBM disclosed in Japanese Patent No. 3256555, a logical address of a failed memory cell is associated with a physical layout of the memory cell in the SRAM macro 200 on the system LSI chip 1000, and is converted to a physical address, which is a two-dimensional coordinate value for two-dimensionally displaying the logical address in a unit of cell area, and displayed. However, the logical address has only a property as information of the sequence of the BIST results extracted from the memory collar 400, and does not include information relating to the I/O address and the relieved I/O unit. Therefore, if the logical address is simply converted to a physical address at the time of generating the FBM indicating a position of the failed memory cell for the SRAM macro 200 having the spare cell area, problems explained with reference to FIGS. 6A, 6B, 7A, and 7B will occur.

Figure 6A:
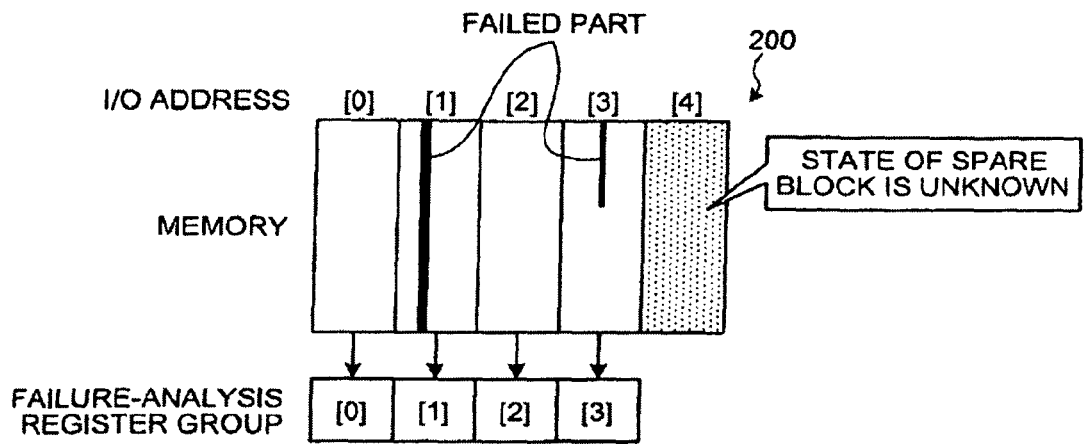
FIGS. 6A and 6B are schematic diagrams for explaining a state where an FBM is generated based on BIST results collected before a relieving process.
Figure 6B:
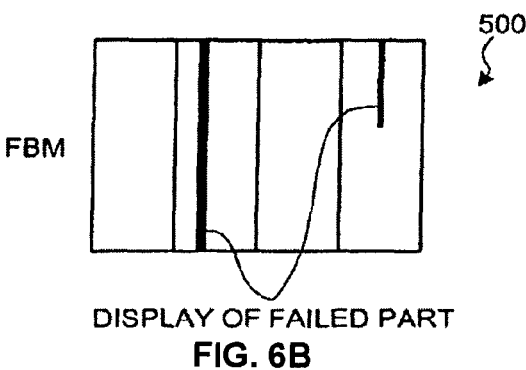

FIGS. 6A and 6B are schematic diagrams for explaining a state where an FBM is generated based on BIST results collected before a relieving process. Because read data of I/O units 0 to 3 are stored respectively in failure analysis registers [0] to [3], BIST results associated with the sub-memory arrays 210 of the I/O units 0 to 3 are serially output, and a physical address based on the output sequence is allocated to the BIST results. If a logical address is converted to a physical address, an FBM 500 corresponding to an array of the sub-memory array 210 of the I/O units 0 to 3 and a matrix array of the memory cells in the respective sub-memory arrays 210 can be acquired from a result of conversion. A display array of the sub-memory array 210 of the I/O units 0 to 3 in the FBM 500 corresponds to the array of the sub-memory array 210 of the I/O units 0 to 3 in the actual SRAM macro. It can be easily viewed from the FBM display that there is a failed part in the sub-memory arrays 210 of the I/O units 1 and 3. However, because the state of the sub-memory array 210 of the I/O unit 4 is not displayed, a position of the failed memory cell in the sub-memory array 210 of the I/O unit 4, that is, the state of a spare block cannot be recognized.

Figure 7A:
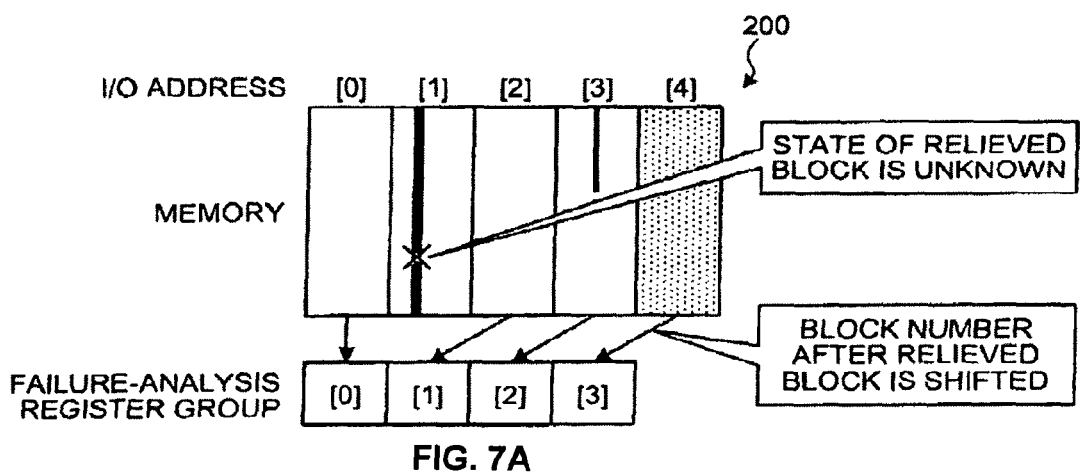
FIGS. 7A and 7B are schematic diagrams for explaining a state where an FBM is generated based on BIST results collected after a relieving process.
Figure 7B:
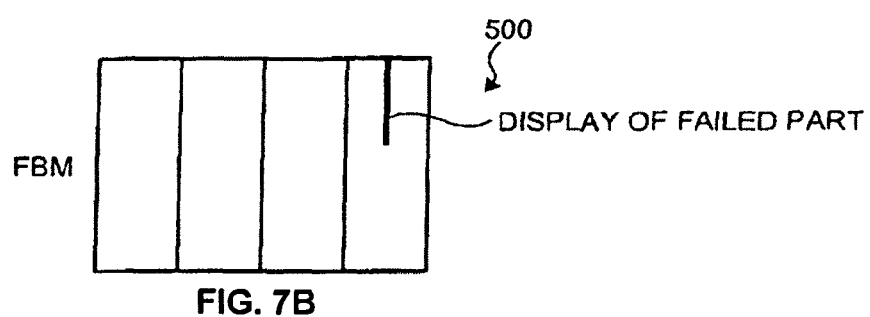

FIG. 7 is a FIGS. 7A and 7B are schematic diagram diagrams for explaining a state where an FBM is generated based on BIST results collected after the I/O unit 1 is relieved. Because the I/O unit 1 is relieved, read data of the I/O units 0, 2, 3, and 4 are respectively input to the failure analysis registers [0] to [3], and BIST results associated with the sub-memory arrays 210 of the I/O units 0, 2, 3, and 4 are output in a one-dimensional array. The logical address as a result of output in the one-dimensional sequence does not include the information of the I/O address. Therefore, if the FBM 500 is generated based on the result and displayed by converting the logical address to the physical address, the state of the I/O unit 2 is displayed on the right of the state of the I/O unit 0, the I/O unit 3 is displayed on the right of the state of the I/O unit 2, and the state of the I/O unit 4 as the spare cell is displayed on the right of the state of the I/O unit 3. When only the FBM 500 is viewed, it cannot be recognized as to which I/O unit has been relieved. Even if it is recognized that the relieved I/O unit is the I/O unit 1, the state of the sub-memory array 210 cannot be recognized, because the state of the sub-memory array 210 of the I/O unit 1 is not displayed.

That is, according to the conventional method, the FBM cannot be generated by acquiring the BIST results of the entire memory array of the SRAM macro with spare cell. Further, if there is a relieved sub-memory array, an area corresponding to the part of the relieved sub-memory array is deleted and displayed in the FBM coordinate system. Therefore, it is difficult for a user to associate the position on the FBM with the position of the memory array in the SRAM macro with spare cell. Because association between the position on the FBM and the position of the memory array in the SRAM macro with spare cell is difficult, an analysis position can be wrong at the time of performing a physical analysis based on the FBM. An embodiment of the present invention has a main characteristic such that an FBM of the entire memory array of the SRAM macro with spare cell is generated.

Figure 8:
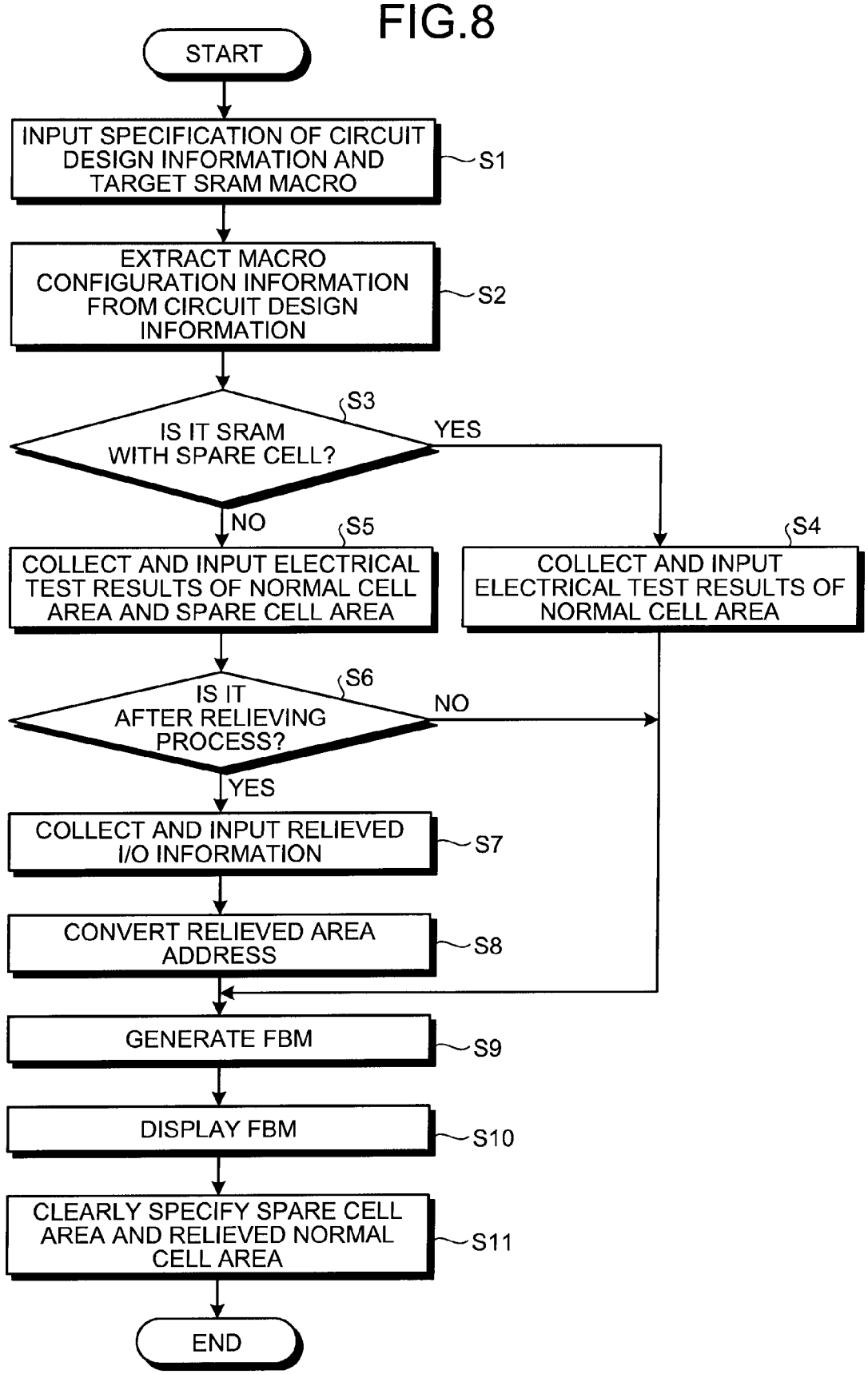
FIG. 8 is a flowchart for explaining a failure analysis method according to an embodiment of the present invention.
Figure 9:
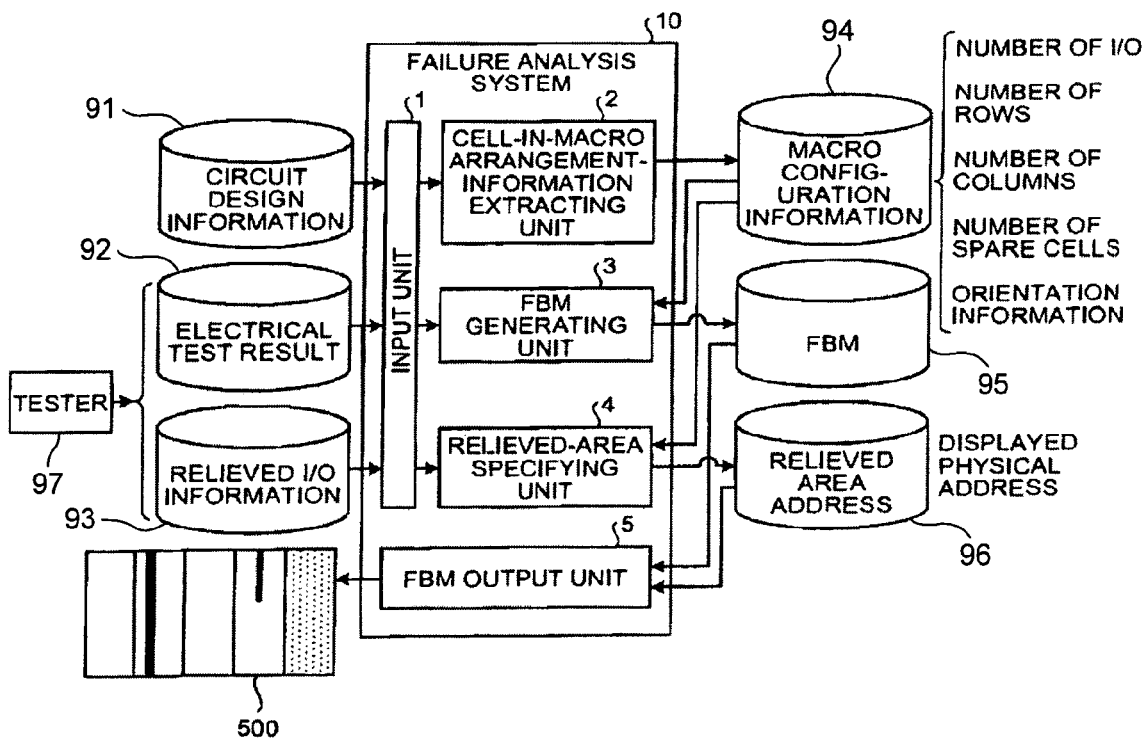
FIG. 9 is a block diagram for explaining a configuration of a failure analysis system.

FIG. 8 is a flowchart for explaining a failure analysis method according to the embodiment. FIG. 9 is a block diagram of a configuration of a failure analysis system used for the failure analysis method. As shown in FIG. 9, a failure analysis system 10 includes: an input unit 1 that receives an input of circuit design information 91, electrical test results 92, and relieved I/O information 93; a cell-in-macro arrangement-information extracting unit 2 that extracts the number of I/O, the number of rows, the number of columns of the normal cell area, the number of I/O of the spare cell area, and orientation information as a macro configuration information 94 from the circuit design information received by the input unit 1; an FBM generating unit 3 that generates an FBM 95 by converting a logical address to a physical address based on the electrical test result received by the input unit 1 and the macro configuration information extracted by the cell-in-macro arrangement-information extracting unit 2; a relieved-area specifying unit 4 that determines a physical address (relieved area address 96) on the FBM of the cell array included in the relieved I/O unit based on the relieved I/O information received by the input unit 1; and an FBM output unit 5 that outputs the generated FBM on a display device or the like based on the relieved area address so that the I/O unit in the spare cell area, the relieved I/O unit, and an unrelieved I/O unit can be recognized. The failure analysis method according to the present embodiment is performed as explained below by using the failure analysis system 10 shown in FIG. 9.

As shown in FIG. 8, a user performs an input for specifying circuit design information of a system LSI chip and a SRAM macro for which an FBM is to be generated among the SRAM macros mounted on the system LSI chip (Step S1). When the input unit 1 receives a specification of the circuit design information and the SRAM macro input at Step S1, the cell-in-macro arrangement-information extracting unit 2 extracts the macro configuration information of the specified SRAM macro from the input circuit design information (Step S2).

Subsequently, when the SRAM macro for which the FBM is to be generated is not a SRAM macro with spare cell (NO at Step S3), the user collects electrical test results of the normal cell area from the SRAM macro for which the FBM is to be generated by using a tester 97, and inputs the electrical test results to the input unit 1 (Step S4). The FBM generating unit 3 generates an FBM based on the electrical test results (BIST results) of the logical address sequence received by the input unit 1 and the macro configuration information (Step S9). Details of a method of converting the logical address to the physical address, which is performed at the time of generating the FBM by the FBM generating unit 3, will be explained later with reference to a specific example.

When the SRAM macro for which the FBM is to be generated is the SRAM macro with spare cell (YES at Step S3), the user collects electrical test results (BIST results) of all the memory cells in the cell area including the normal cell area and the spare cell area from the SRAM macro for which the FBM is to be generated by using the tester, and inputs the electrical test results arranged in the collected logical address (Step S5).

Figure 10:
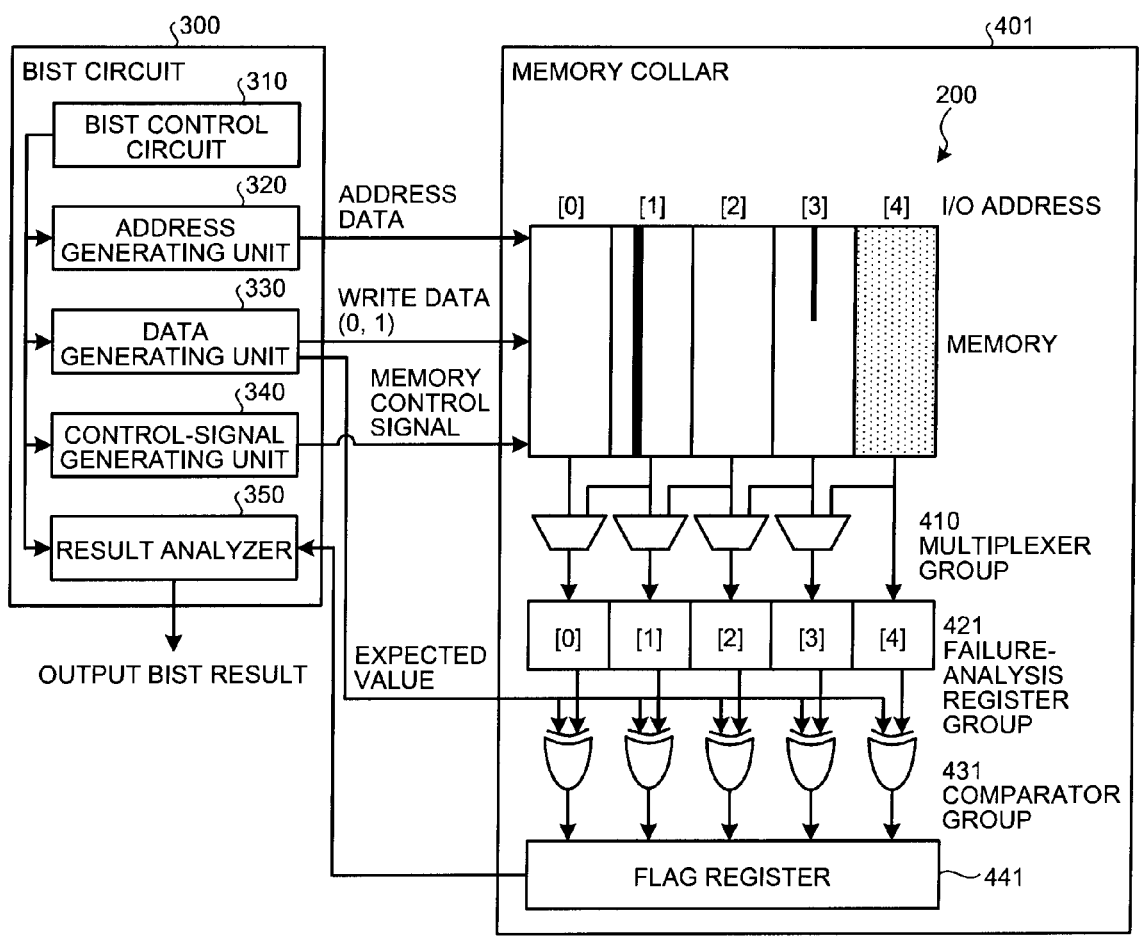
FIG. 10 is a block diagram for explaining a configuration of a memory macro system according to the embodiment.

The memory macro system including the SRAM macro with spare cell is configured beforehand so that the electrical test results of the normal cell area and the spare cell area can be collected by the tester. FIG. 10 is a block diagram for explaining the configuration of the memory macro system according to the present embodiment.

As shown in FIG. 10, a memory collar 401 of the SRAM macro is provided with a failure analysis register and a comparator for the spare cell area in addition to the configuration of the memory collar 400 of the conventional SRAM macro explained with reference to FIG. 4, and the flag register has a capacity for storing not only the comparison results from the comparators for the normal cell area but also comparison results from the comparator for the spare cell area. The BIST circuit 300 and respective constituent elements of the BIST circuit 300 are identical to those explained in FIG. 4. In FIG. 10, the multiplexer group 410 put between the I/O units 0 to 4 and five failure analysis registers [0] to [4] constituting a failure-analysis register group 421 is set such that test results of the I/O units 0 to 4 are respectively input to the failure analysis registers [0] to [4]. Alternatively, the multiplexer group 410 can be omitted, and the I/O units 0 to 4 can be connected respectively to the failure analysis registers [0] to [4] so that outputs from the I/O units 0 to 4 are directly input to the failure analysis registers [0] to [4], respectively. The outputs from the I/O units 0 to 4 input to the failure analysis registers [0] to [4] are respectively compared with expected values of data generated by the data generating unit 330 by five comparators constituting a comparator group 431, and comparison results are held in a flag register 441. Output data held in the flag register 441 is input to the result analyzer 350 in the BIST circuit 300, and a final BIST result is output. That is, it is recognized that because the electrical test results of all the I/O units including the normal cell area and the spare cell area are output as the BIST result, the memory macro system shown in FIG. 10 can collect the BIST results output in an array based on the logical address by the tester.

Referring back to FIG. 8, after Step S5, the user judges whether the SRAM macro for which the FBM is to be generated has been already relieved (Step S6). Specifically, when the user uses the tester to read fuse information of the redundancy circuit incorporated in the system LSI chip 1000, and the I/O address of the I/O unit in the normal cell area of the SRAM macro for which the FBM is to be generated is stored in the fuse information, it is judged that the SRAM macro for which the FBM is to be generated has been already relieved (YES at Step S6), and the user inputs the I/O address stored in the fuse information as the relieved I/O information (Step S7).

The relieved-area specifying unit 4 then converts the I/O address as the relieved I/O information received by the input unit 1 to a relieved area address (Step S8). Control then proceeds to Step S9.

At Step S6, if the I/O address of the I/O unit in the normal cell area of the SRAM macro for which the FBM is to be generated is not stored in the fuse information, it is judged that the SRAM macro for which the FBM is to be generated has not yet been relieved (NO at Step S6), and operations at Steps S7 and S8 are skipped, to proceed to Step S9.

Subsequently to Step S9, the FBM output unit 5 displays and outputs the FBM generated by the FBM generating unit 3 on a display device (Step S10). Further, when the FBM of the SRAM macro with spare cell is output, the FBM output unit 5 clearly specifies the spare cell area, and when there is a relieved I/O unit, clearly specifies a part corresponding to the relieved area address determined by the relieved-area specifying unit 4 (Step S11). As a method of clearly specifying the spare cell area and the relieved area, for example, any display method can be used so long as it can be distinguished that the spare cell area and the relieved area are different from the normal cell area, such as coloring, color reversal, or blinking.

Figure 11A:
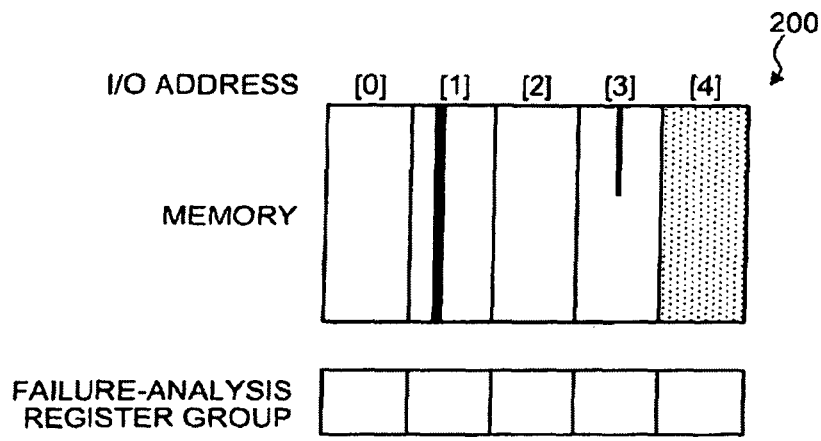
FIGS. 11A and 11B are schematic diagrams for explaining a state where an FBM is generated according to the embodiment.
Figure 11B:
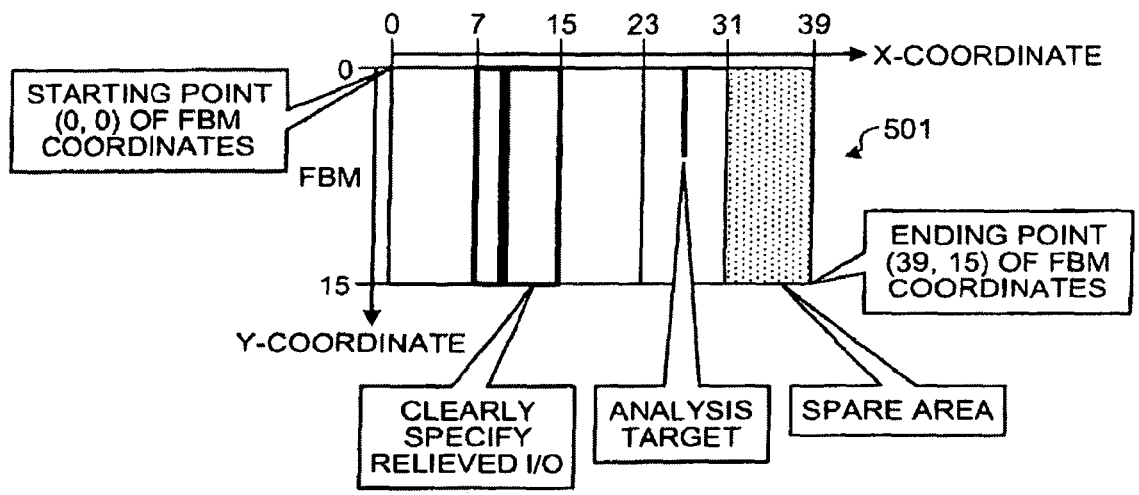

With reference to FIGS. 11A and 11B, and FIG. 12, an example in which an FBM is generated by performing the above steps is explained by specifically showing a method of generating a physical address from a logical address. FIGS. 11A and 11B are schematic diagrams for explaining a state where an FBM is generated according to the present embodiment. The orientation of the SRAM macro is the arrangement "N".

First, the cell-in-macro arrangement-information extracting unit 2 extracts the macro configuration information indicating that the number of I/O in the normal cell area is four, the number of rows is 16, the number of columns is eight, the number of I/O in the spare cell area is one, and the orientation information is the arrangement "N", from the circuit design information at Step S2.

The user then collects electrical test results of the I/O units 0 to 3 as the normal cell area and the I/O unit 4 as the spare cell area by the tester. FIG. 12 is a schematic diagram for explaining an example of allocation of the logical address with respect to the electrical test results of respective memory cells included in the SRAM macro 200 shown in FIG. 11A. The sub-memory arrays 210 of a plurality of I/O units constituting the SRAM macro are regarded as one mass, even if the SRAM macro is laid out in any direction. A memory cell positioned at an end of the origin mark side, of the memory cells positioned at the upper end of the mass, as viewed such that the column decoder 230 is on a lower side on the drawing, is designated as 0, and the logical address is allocated in an ascending order from the memory cell 0 toward a side opposite to the origin mark side. That is, as shown in FIG. 12, the logical address is allocated to the memory cell in each row of the sub-memory array 210 of each I/O unit in the ascending order toward the right on the drawing, and the logical address next to the rightmost memory cell is allocated to the leftmost memory cell in the same row of the sub-memory array 210 of the I/O unit immediate right. The logical address next to the rightmost memory cell of the I/O unit 4 is allocated to the leftmost memory cell in the row immediate below of the sub-memory array 210 of the I/O unit O. The logical address of the upper left memory cell of I/O unit 0 is O.

In the FBM generating unit 3, the logical address of a failed memory cell is converted to a physical address, to generate FBM data. The logical addresses arranged as shown in FIG. 12 have a following relation with respect to a physical address (x, y), in which an upper left in FBM coordinates is designated as an origin (0, 0). That is, Logical address=$x+y\times$(number of columns)×((number of I/O in normal cell area)+(number of I/O in spare cell area)) (1);

$0 \leq x \leq$(number of columns)×((number of I/O in normal cell area)+(number of I/O in spare cell area))−1 (2);

$0 \leq y \leq$(number of rows)−1 (3).

By using the relation shown in the equations (1) to (3), conversion from the logical address to the physical address is performed. When a coordinate of a rectangular area indicating the SRAM macro 200 is expressed by two points of an upper left end (starting point) and a lower right end (ending point) in an FBM display, the starting point becomes (0, 0), and a physical address of the ending point becomes as described below:

Ending x-coordinate: {(number of I/O in normal cell area)+(number of spare I/O)}×(number of columns)−1= (4+1)+8−1=39, and Ending y-coordinate: (number of rows)−1=15.

That is, the position of each memory cell of the memory cells included in the SRAM macro 200 is expressed in the rectangular area with the starting point (0, 0) and the ending point (39, 15).

Further, the FBM generating unit 3 performs conversion described below to calculate a coordinate of a spare cell area (the sub-memory array 210 of the I/O unit 4) in the FBM coordinate system explained above. That is, x-coordinate of starting point of spare cell area: (I/O address of spare cell area)×(number of columns)−1=4× 8−1=31, y-coordinate of starting point of spare cell area: 0, x-coordinate of ending point of spare cell area: {(I/O address of spare cell area)+1}×(number of columns)−1= (4+1)×8−1=39, and y-coordinate of ending point of spare cell area: (number or rows)−1=16−1=15.

That is, a position of a failed memory cell of the I/O unit 4, which is a spare cell area, is expressed in a rectangular area with the starting point (31, 0) and the ending point (39, 15).

When it is assumed that I/O address "1" is collected as the relieved I/O information by the tester, the relieved-area specifying unit 4 performs conversion described below at Step S8, to calculate an address of the relieved area, that is, a coordinate of the relieved area on the FBM display.

x-coordinate of starting point of relieved area: (address of relieved I/O unit)×(number of columns)−1=1×8−1=7, y-coordinate of starting point of relieved area: 0, x-coordinate of ending point of relieved area: {(address of relieved I/O unit)+1}×(number of columns)−1=(1+1)× 8−1=15, and y-coordinate of ending point of relieved area: (number or rows)−1=16−1=15.

That is, a position of a failed memory cell of the relieved I/O unit 1 is expressed in a rectangular area with the starting point (7, 0) and the ending point (15, 15).

Finally, as shown by 501 in FIG. 11, the FBM output unit 5 displays a rectangular area represented by a starting point (31, 0) and an ending point (39, 15), which is a spare cell area, and a rectangular area represented by a starting point (7, 0) and an ending point (15, 15) corresponding to a relieved cell area, that is, a position of the I/O unit 1 so that these rectangular areas can be recognized from unrelieved I/O units. Accordingly, the I/O units a to 3 and the I/O unit 4 as the spare cell area are displayed in the FBM, in a state with an actual arrangement sequence of respective I/O units being maintained. Therefore, the user can easily associate a failed part displayed on the FBM with a failed part in the actual SRAM macro. That is, it is not required to change the interpretation of the failed part displayed on the FBM according to whether it is before or after the relieving process and which memory cell has been relieved as in the conventional case. Accordingly, the number of cases in which the position to be analyzed is mistaken can be decreased. Further, the FBM output unit 5 clearly specifies the coordinate-calculated spare cell area and relieved area. Accordingly, the user can ascertain a failed part in the spare cell area. When there is a relieved I/O unit, the user can ascertain a failed part of the relieved I/O unit.

If the SRAM macro for which the FBM is to be generated is laid out in an arrangement other than the arrangement "N", the FBM generating unit 3 and the relieved-area specifying unit 4 determine once a coordinate value of a reference arrangement (the arrangement "N") as a provisional FBM coordinates value according to the method explained above, and performs conversion by at least one of rotation and inversion by using a following relation based on the orientation information with respect to the generated provisional FBM coordinates value, thereby determining a final FBM coordinates value.

When it is assumed that the final FBM coordinates value is (X, Y), and the provisional FBM coordinates value is (x, y), in the case of SRAM macro in the arrangement "FS", there are following relations:
  X=x;
  Y=(number of rows)−y−1.
In the case of SRAM macro in the arrangement "FN", there are following relations:
  X={(number of I/O in normal cell area)+(number of spare I/O)}×(number of columns)−x−1;
  Y=y.
In the case of SRAM macro in the arrangement "S", there are following relations:
  X={(number of I/O in normal cell area)+(number of spare I/O)}×(number of columns)−x−1;
  Y=(number of rows)−y−1.
In the case of SRAM macro in the arrangement "E", there are following relations:
  X=y;
  Y=x.
In the case of SRAM macro in the arrangement "FE", there are following relations:
  X=(number of rows)−y−1;
  Y=x.
In the case of SRAM macro in the arrangement "W", there are following relations:
  X=(number of rows)−y−1;
  Y={(number of I/O in normal cell area)+(number of spare I/O)}×(number of columns)−x−1.
In the case of SRAM macro with the arrangement "FW", there are following relations:
  X=y;
  Y={(number of I/O in normal cell area)+(number of spare I/O)}×(number of columns)−x−1.

By converting the provisional FBM coordinates value (x, y) to the final FBM coordinates value (X, Y) using the above relations, a physical address corresponding to the arrangement on the system LSI chip can be calculated, for the SRAM macro laid out in any orientation. The address of the relieved area and the address of the spare cell area can be converted by using the above relations.

In the above explanations, the redundancy circuit can be configured to use a nonvolatile storage element such as an electronically erasable programmable read only memory (EEPROM) or erasable programmable read only memory (EPROM) instead of the fuse as a part for storing the failed I/O address. In this case, a user should read the failed I/O address stored in the nonvolatile storage element by using a tester, and designate it as relieved I/O information.

Further, the failure analysis system 10 can be realized by using a general computer including a control unit such as a central processing unit (CPU), a storage unit such as a read only memory (ROM) or a random access memory (RAM), an external storage unit such as a hard disk drive (HDD) or a compact disk (CD) drive, a display unit such as a display device, and an input device such as a keyboard and a mouse.

A failure analysis program executed by the failure analysis system 10 is recorded on a computer readable recording medium such as a CD-ROM, a flexible disk (FD), a CD recordable (CD-R), a digital versatile disk (DVD) or the like in an installable or executable format and provided.

The failure analysis program executed by the failure analysis system 10 according to the present embodiment can be stored on a computer connected to a network such as the Internet, downloaded through the network and provided. Alternatively, the failure analysis program executed by the failure analysis system 10 can be provided or distributed through a network such as the Internet.

The failure analysis program according to the present embodiment can be incorporated beforehand in a ROM or the like and provided. The failure analysis program executed by the failure analysis system 10 has a module configuration including the respective constituent elements described above (the input unit 1, the cell-in-macro arrangement-information extracting unit 2, the FBM generating unit 3, the relieved-area specifying unit 4, and the FBM output unit 5). As actual hardware, when the failure analysis program is read from the recording medium and executed by a CPU (processor), the respective units are loaded on a main memory, so that the input unit 1, the cell-in-macro arrangement-information extracting unit 2, the FBM generating unit 3, the relieved-area specifying unit 4, and the FBM output unit 5 are generated on the main memory.

Further, when the tester or a control unit of the tester include a configuration as a general computer, the failure analysis program according to the present embodiment can be executed by the tester or a computer as the control unit of the tester, thereby realizing the failure analysis system 10.

It has been explained that the FBM output unit 5 outputs the FBM on the display unit. However, when the failure analysis system 10 is connected to a printing device such as a printer, the FBM can be output to the printing device. The FBM output unit 5 can also output the FBM as image data that can be output to the display unit or the printing device, or as data for forming the image data.

As described above, according to the embodiment of the present invention, the electrical test results of the memory cells included in all cell areas arranged in the memory macro are serially collected, a logical address corresponding to the collection order of the electrical test results is converted to a physical address, which is a two-dimensional coordinate value for two-dimensionally displaying the logical address in a unit of cell area in association with a physical layout, and the electrical test results are displayed based on the two-dimensional coordinate value so that normal cell areas and spare cell area can be distinguished. Accordingly, a failed part displayed on the FBM and the actual failed part in the SRAM macro can be easily associated with each other, and the FBM easily understood by a user can be generated. Further, because a relieved normal cell area and an unrelieved normal cell area are distinguishably displayed based on relieved cell area information indicating which cell area has been relieved, the user can ascertain whether it is before or after the relieving process as well as the state of relieved cell area, thereby enabling to generate the FBM easily understandable by the user. Further, arrangement information corresponding to the collection order of the electrical test results is converted to a physical address based on the reference arrangement, and the physical address based on the reference arrangement is at least rotated or inverted based on the orientation information, to calculate a two-dimensional coordinate value corresponding to the arrangement of the memory macro for which the FBM is to be generated. Therefore, an FBM corresponding to an arrangement on a system LSI chip can be generated for a SRAM macro laid out in any orientation.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method comprising:
   extracting configuration information including a number of normal cell areas and a number of spare cell areas arranged in a memory macro mounted on a semiconductor chip and a size of each cell area from circuit design information;
   reading electrical test results from an electrical test circuit detecting a failed memory cell by performing a self test, the electrical test results indicating whether each memory cell included in the normal cell areas and the spare cell areas arranged in the memory macro has a failure;
   converting arrangement information of the each memory cell corresponding to a collection order of the electrical test results to a two-dimensional coordinate value for two-dimensionally displaying the arrangement information in a unit of cell area in association with a physical layout of a memory cell in the memory macro based on the configuration information; and
   displaying the collected electrical test results based on the two-dimensional coordinate value so that the normal cell areas and the spare cell areas can be distinguished.

2. The method according to claim 1, further comprising:
   collecting relieved cell area information indicating which normal cell area has been relieved and converting the collected relieved cell area information to a two-dimensional coordinate value, wherein
   a display mode of the normal cell area is changed based on the relieved cell area information converted to the two-dimensional coordinate value, so that a relieved normal cell area and an unrelieved normal cell area can be distinguished.

3. The method according to claim 1, wherein
   the configuration information further includes orientation information indicating whether an arrangement of the memory macro on the semiconductor chip is rotationally symmetric and whether it is reflectionally symmetric to a reference arrangement,
   the arrangement information is converted to the two-dimensional coordinate value based on the reference arrangement, and the two-dimensional coordinate value acquired by conversion based on the reference arrangement is further converted by at least one of rotation and inversion based on the orientation information, and
   the collected electrical test results are displayed based on the two-dimensional coordinate value, which is converted by at least one of rotation and inversion.

4. The method according to claim 3, wherein an origin for associating the arrangement of the memory macro with the reference arrangement on the semiconductor chip is set beforehand in the memory macro, and the electrical test results of the memory macro are collected in an order corresponding to an arranged position of the origin in the memory macro.

5. A system comprising:
   an input unit that receives:
      circuit design information of a memory macro having normal cell areas and spare cell areas mounted on a semiconductor chip,
      electrical test results read from an electrical test circuit detecting a failed memory cell by performing a self test, the electrical test results indicating whether each memory cell included in the normal cell areas and the spare cell areas arranged in the memory macro has a failure, and
      an input of relieved cell area information indicating which normal cell area has been relieved;
   a configuration-information extracting unit that extracts configuration information including a number of normal cell areas and a number of spare cell areas arranged in the memory macro and a size of each cell area from the circuit design information;
   a two-dimensional coordinate-value calculator that converts arrangement information of the each memory cell corresponding to a collection order of the electrical test results to a two-dimensional coordinate value for two-dimensionally displaying the arrangement information in a unit of cell area in association with a physical layout of a memory cell in the memory macro based on the configuration information;
   a relieved-area specifying unit that converts the input relieved cell area information to a two-dimensional coordinate value; and
   an output unit that two-dimensionally displays the collected electrical test results so that a relieved normal cell area, an unrelieved normal cell area, and a spare cell area can be distinguished, based on a two-dimensional coordinate value converted by the two-dimensional coordinate-value calculator and the relieved-area specifying unit.

6. The system according to claim 5, wherein
   the configuration information further includes orientation information indicating whether an arrangement of the memory macro on the semiconductor chip is rotationally symmetric and whether it is reflectionally symmetric to a reference arrangement,
   the two-dimensional coordinate-value calculator converts the arrangement information to the two-dimensional coordinate value based on the reference arrangement, and the two-dimensional coordinate value acquired by conversion based on the reference arrangement is further converted by at least one of rotation and inversion based on the orientation information, and
   the relieved-area specifying unit converts the input relieved cell area information to the two-dimensional coordinate value based on the reference arrangement, and the two-dimensional coordinate value acquired by conversion based on the reference arrangement is further converted by at least one of rotation and inversion based on the orientation information.

7. The system according to claim 6, wherein an origin for associating the arrangement of the memory macro with the reference arrangement on the semiconductor chip is set beforehand in the memory macro, and the electrical test results of the memory macro received by the input unit are collected in an order corresponding to an arranged position of the origin in the memory macro.

\* \* \* \* \*